(12) United States Patent
Hopper et al.

(10) Patent No.: US 7,880,261 B2
(45) Date of Patent: Feb. 1, 2011

(54) ISOLATION TECHNIQUE ALLOWING BOTH VERY HIGH AND LOW VOLTAGE CIRCUITS TO BE FABRICATED ON THE SAME CHIP

(75) Inventors: Peter J. Hopper, San Jose, CA (US);
William French, San Jose, CA (US);
Ann Gabrys, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 173 days.

(21) Appl. No.: 12/165,933

(22) Filed: Jul. 1, 2008

(65) Prior Publication Data

US 2010/0001365 A1    Jan. 7, 2010

(51) Int. Cl.
*H01L 21/70*    (2006.01)

(52) U.S. Cl. .............. 257/501; 257/503; 257/E29.02; 257/E21.628; 257/E21.642; 438/219; 438/295; 438/404

(58) Field of Classification Search ................. 438/219, 438/295, 355, 404, FOR. 222, 296, 406, FOR. 227; 257/500, 501, 506, E29.02, E21.574, E21.628, 257/E21.642
See application file for complete search history.

(56) References Cited

U.S. PATENT DOCUMENTS

| | | | | |
|---|---|---|---|---|
| 6,667,226 | B2 * | 12/2003 | Pinto et al. | 438/524 |
| 6,867,103 | B1 * | 3/2005 | Yu | 438/289 |
| 2003/0045071 | A1 * | 3/2003 | Hong et al. | 438/427 |
| 2005/0006337 | A1 * | 1/2005 | Takeda | 216/23 |
| 2009/0174027 | A1 * | 7/2009 | Tilke | 257/513 |

* cited by examiner

*Primary Examiner*—Matthew S Smith
*Assistant Examiner*—Quovaunda Jefferson
(74) *Attorney, Agent, or Firm*—Dergosits & Noah LLP

(57) ABSTRACT

An integrated circuit (IC) fabrication technique is provided for isolating very high voltage (1000s of volts) circuitry and low voltage circuitry formed on the same semiconductor die. Silicon-on-Insulator (SOI) technology is combined with a pair of adjacent backside high voltage isolation trenches that are fabricated to be wide enough to stand off voltages in excess of 1000V. The lateral trench is fabricated at two levels: the active silicon level and at the wafer backside in the SOI bulk.

7 Claims, 6 Drawing Sheets

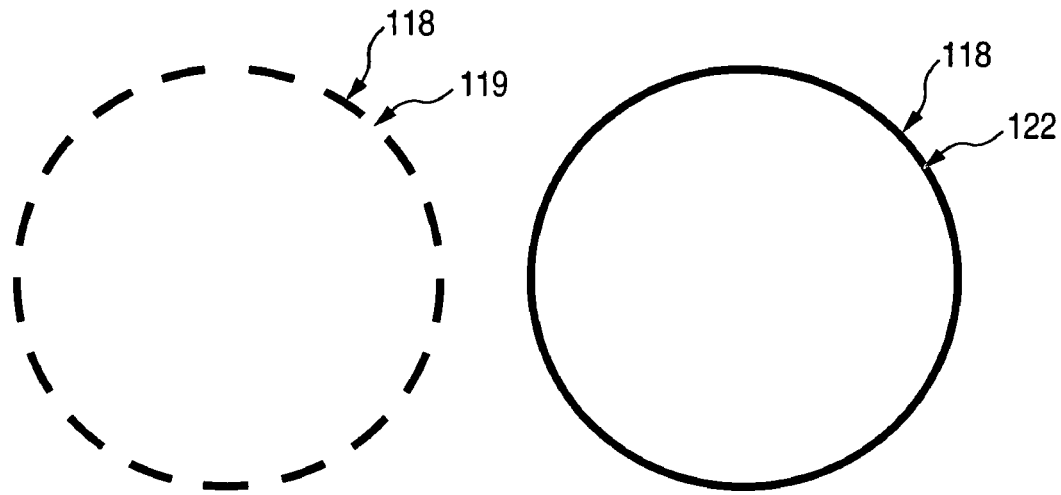
FIG. 3A  FIG. 3B
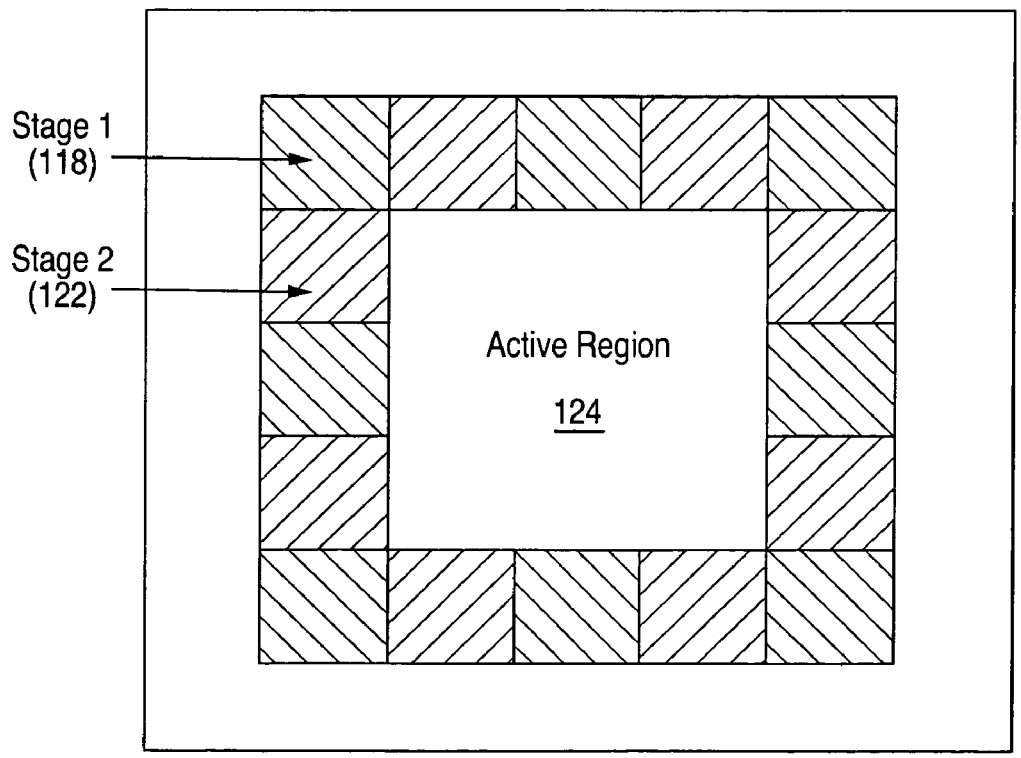
FIG. 4

US 7,880,261 B2

ISOLATION TECHNIQUE ALLOWING BOTH VERY HIGH AND LOW VOLTAGE CIRCUITS TO BE FABRICATED ON THE SAME CHIP

FIELD OF THE INVENTION

The present invention relates to integrated circuit devices and, in particular, to techniques for isolating very high voltage (1000 s of volts) circuitry and low voltage circuitry that are formed on the same semiconductor die.

DISCUSSION OF THE RELATED ART

Integrated circuit (IC) applications increasingly require that the IC device accommodate both very high voltage circuitry that can be in excess of 1000V and low voltage circuitry that can be in the 3-5V range or less. The device must accommodate and be resilient to both high voltage transient signals and high voltage DC bias. These requirements necessitate that the high voltage circuitry be electrically isolated from the low voltage circuitry.

Isolation between the high voltage circuitry and the low voltage circuitry is typically provided by encapsulating two separate semiconductor die, one for the high voltage circuitry and one for the low voltage circuitry, in a single package, physically isolating the two die from one another and bridging the two die with a transformer. Two separate die are used because conventional integrated circuit isolation technology does not facilitate cohabitation of high voltage circuitry and low voltage circuitry on a single die.

Although silicon-on-insulator (SOI) technology might be considered as a possible solution, it does not appear that currently available SOI box technology can provide sufficient insulator thickness to vertically isolate 5000V or more, as required in some IC applications.

SUMMARY OF THE INVENTION

The present invention combines the use of silicon-on-insulator (SOI) technology with a pair of high voltage lateral isolation trenches that are fabricated to be wide enough to stand off voltages in excess of 1000V. Lateral trenches are fabricated at two levels: (1) at the active silicon level using wide trench techniques and (2) a wide trench located at the wafer backside in the SOI bulk. Adding thick isolation films over and above the active silicon layer to provide overhead isolation and using an epoxy based wafer backside film, the low voltage components of the die are completely isolated from the 1000V (or more) levels.

The features and advantages of the various aspects of the present invention will be more fully understood and appreciated upon consideration of the following detailed description of the invention and the accompanying drawings, which set forth an illustrative embodiment in which the concepts of the present invention are utilized.

BRIEF DESCRIPTION OF THE DRAWINGS

FIGS. 3A and 3B illustrate the preferred two stage manner in which the backside isolation trench is formed in accordance with the concepts of the present invention.

FIG. 4 is a top view drawing illustrating an isolation structure utilizable in forming high voltage circuitry and low voltage circuitry on the same semiconductor die in accordance with the concepts of the present invention.

DETAILED DESCRIPTION OF THE INVENTION

Figure 1:
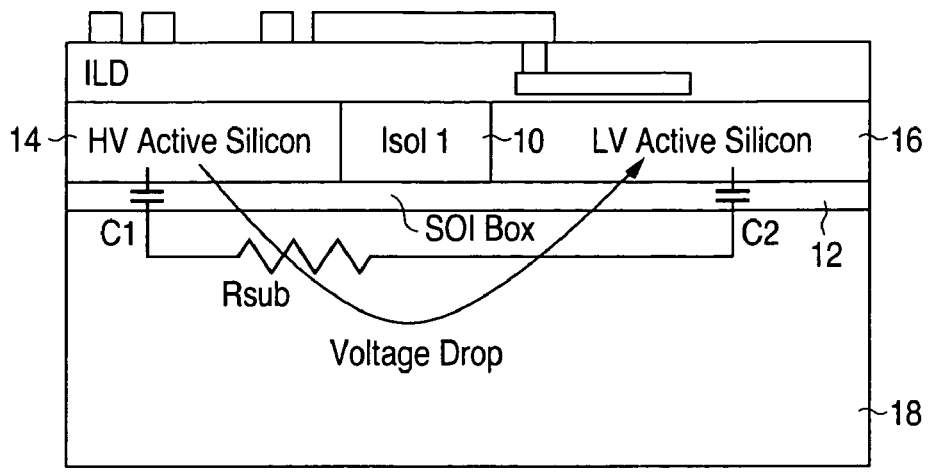
FIGS. 1A is a cross section drawing illustrating problems associated with forming high voltage circuitry and low voltage circuitry on the same semiconductor die.

FIG. 1 shows the historic problem encountered when using both lateral trench isolation 10 (Isol 1) and vertical silicon-on-insulator (SOI) isolation 12 to electrically isolate high voltage circuitry 14 of 1000V or more and low voltage circuitry 16 of, for example, 3-5V or less formed in a single semiconductor substrate 18. That is, the isolation is limited by the thickness of the SOI box 12 and, thus, may perform only to the "hundreds of volts" level and be unable to stand off the "thousands of volts" levels required in some current IC applications.

FIGS. 2A-2H illustrate an embodiment of a sequence of IC fabrication steps for forming electrically isolated high voltage and low voltage circuitry on the same semiconductor die in accordance with the concepts of the present invention.

Figure 2A:
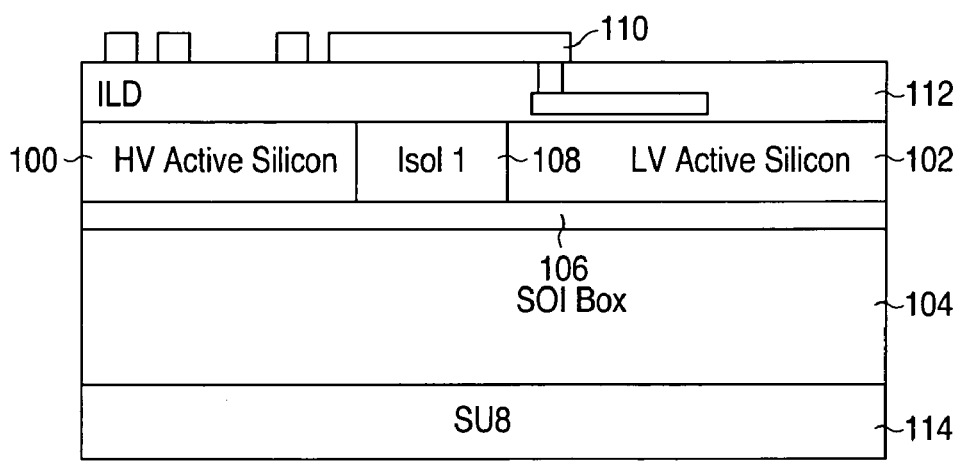
FIGS. 2A-2H are cross section drawings illustrating a sequence of steps for fabricating high voltage circuitry and a low voltage circuitry on the same semiconductor die in accordance with the concepts of the present invention.

FIG. 2A shows high voltage (HV) active region 100 and low voltage (LV) active region 102 formed in a semiconductor substrate 104, typically crystalline silicon. The HV active silicon 100, which includes high voltage circuitry in the "thousands of volts" level, is isolated from the LV active silicon, which contains low voltage circuitry, by a buried silicon-on-insulator layer 106 (e.g., silicon oxide) formed in the semiconductor substrate 104 in the well known manner and by upper surface wide trench isolation material 108 (Isol 1; e.g., silicon oxide), also formed in the well known manner. As an example, the buried SOI layer 106 can be formed by growing or depositing an oxide layer on the upper surface of a semiconductor wafer 104, typically silicon, and then depositing an epitaxial layer on the oxide layer; the epitaxial layer is then masked, etched and the resulting upper surface wide trench is filled with dielectric material (e.g., silicon dioxide). A multi-layer conductive interconnect structure 110 (e.g., aluminum or copper) is formed in conjunction with interlayer dielectric (ILD) material 112 over the HV active silicon 100 and the LV active silicon 102, also in the well known manner. In accordance with the present invention, the semiconductor wafer 104 is thinned to approximately 200 μm and a layer 114 of insulating material (e.g., SU8, an epoxy based negative photoresist commonly utilized in fabricating ICs) is deposited on the backside of the wafer 104.

Figure 2B:
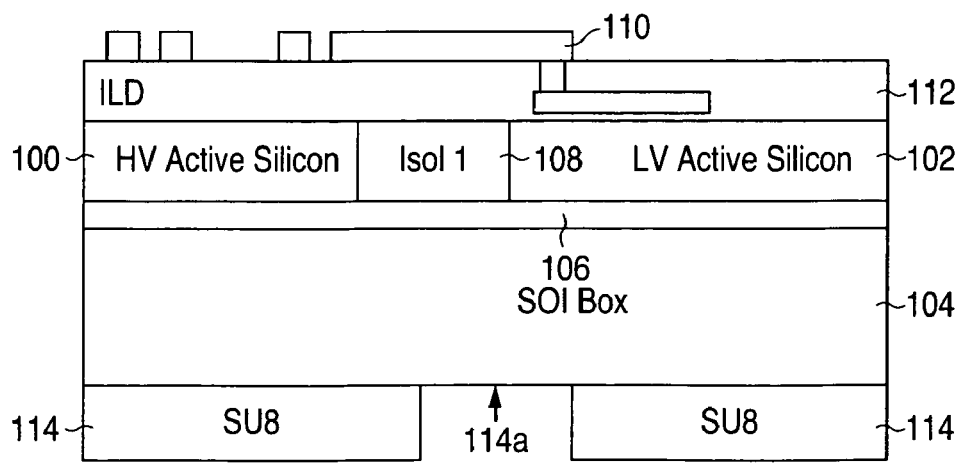

The SU8 layer 114 is then photolithographically imaged, cured and patterned in the conventional manner to expose a surface region 114a of the backside of the wafer 104, as shown in FIG. 2B.

Figure 2C:
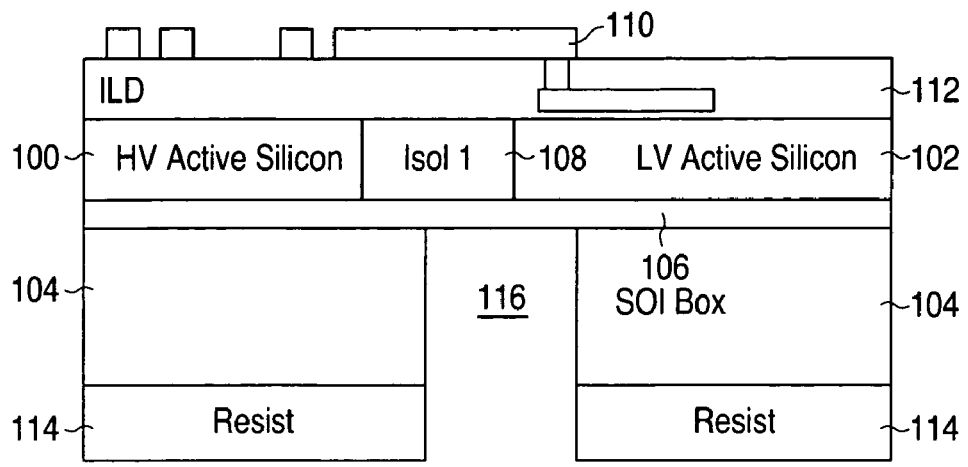

The patterned SU8 mask 114 is then used to etch the exposed silicon 104, stopping on the SOI box layer 106, thereby defining a trench 116 in the backside of the silicon wafer 104, as shown in FIG. 2C.

Figure 2D:
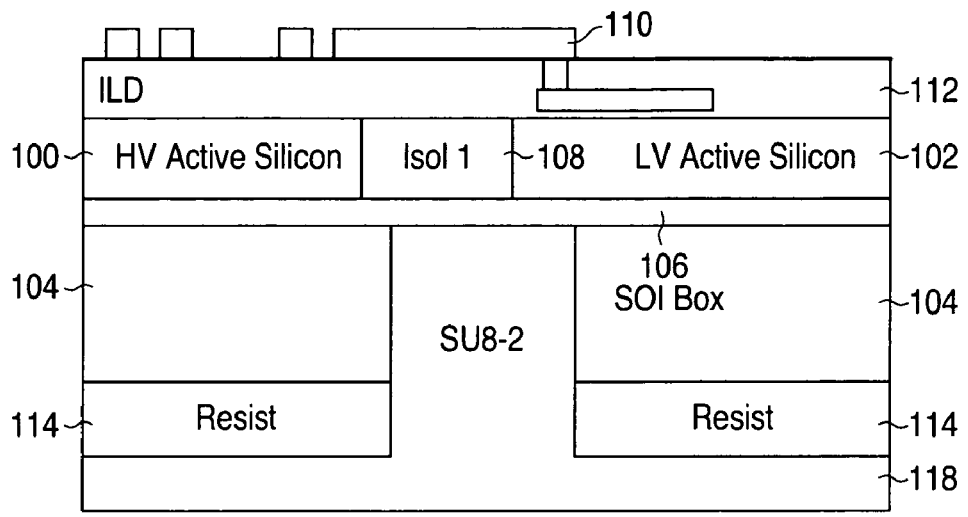
Figure 2E:
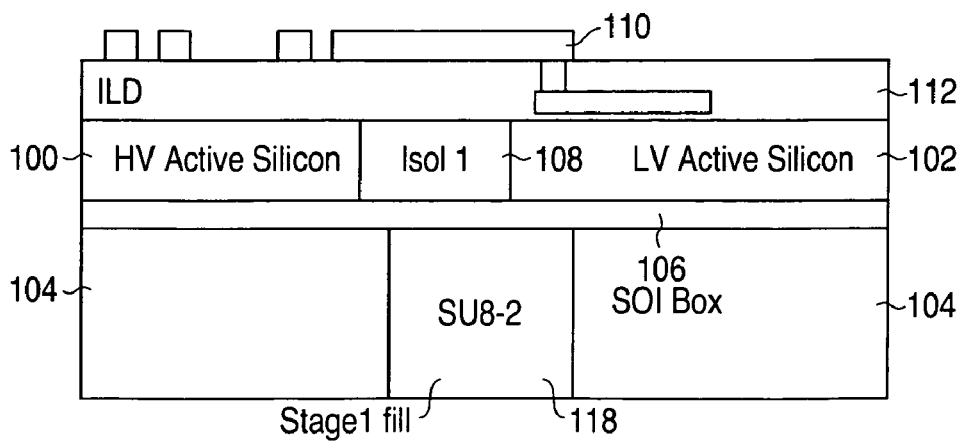

A second layer 118 of SU8 photoresist, or an equivalent material, shown as SU8-2 in FIG. 2D, is then deposited to fill the trench 116 and cured. The cured SU8-2 photoresist layer 118 and the initial cured SU8 photoresist layer 114 are then planarized to the backside of the wafer 104, utilizing for example chemical mechanical polishing (CMP), resulting in the structure shown in FIG. 2E with Stage 1 fill 118 formed in the trench 116.

Figure 2F:
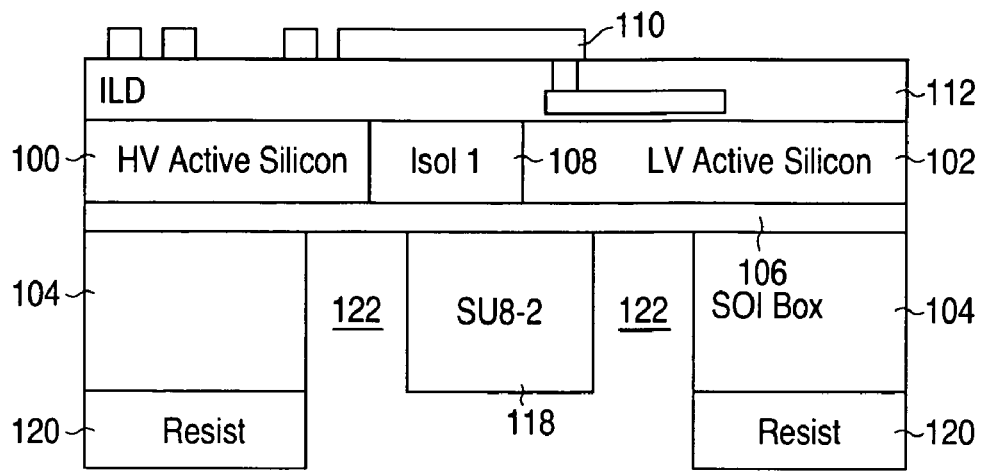
Figure 2G:
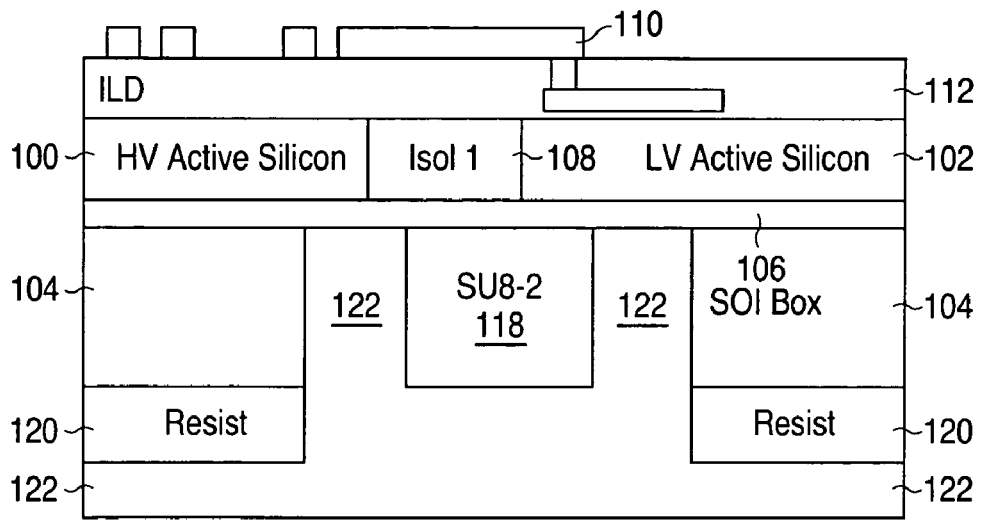

After formation of the Stage 1 fill 118, the trench process is repeated a second time to create a second pass on an interdigitated isolation ring. That is, as shown in FIG. 2F, the back side of the silicon wafer 104 is re-masked with patterned photoresist 120 (e.g., SU8) in the conventional manner and the exposed backside silicon 104 is etched to define a second-stage trench 122 adjacent to the Stage 1 fill 118. The second-stage trench 122 is then re-filled with photoresist 124 (e.g., SU8), resulting in the structure shown in FIG. 2G.

Figure 2H:
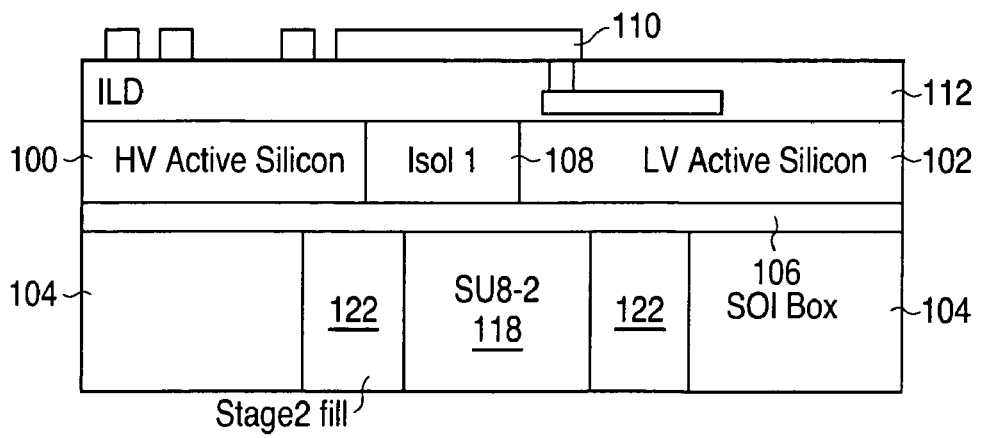

As shown in FIG. 2H, the backside of the wafer is then planarized (e.g., CMP) a second time to remove photoresist 122 and the patterned mask material 120 to expose the backside wafer material 104, thereby defining Stage 2 fill 122 adjacent to the Stage 1 fill 118. The wide trench backside isolation provided by the Stage 1 fill 118 and the Stage 2 fill 122 serves to supplement the SOI box 106 in standing off the high voltage differential that exists between the HV active silicon 100 and the LV active silicon 102.

Those skilled in the art will appreciate that the preferred two stage manner in which the backside trench is formed as described above ensures that the system is always mechanically stable. If a single trench is formed to surround the active device area (e.g., the HV active region), the resulting trench ring around the active area would be held in place by a very thin membrane, raising the possibility that the center of the ring would fall out of itself. By etching the Stage 1 fill trenches 118 as a "dotted line" as shown in FIG. 3A, the ring remains strong and the center of the ring is held together by the "bridges" 119 between the Stage 1 trenches. Once this Stage 1 trench dotted line is etched and filled, the Stage 2 "dotted line" trenches 122 can be formed, self-aligned to the Stage 1 ring, as shown in FIG. 3B.

FIG. 4 shows the dual stage isolation ring that is formed around the active silicon regions 124 on the IC die by the formation of the Stage 1 fill 118 and the Stage 2 fill 122.

Figure 5A:
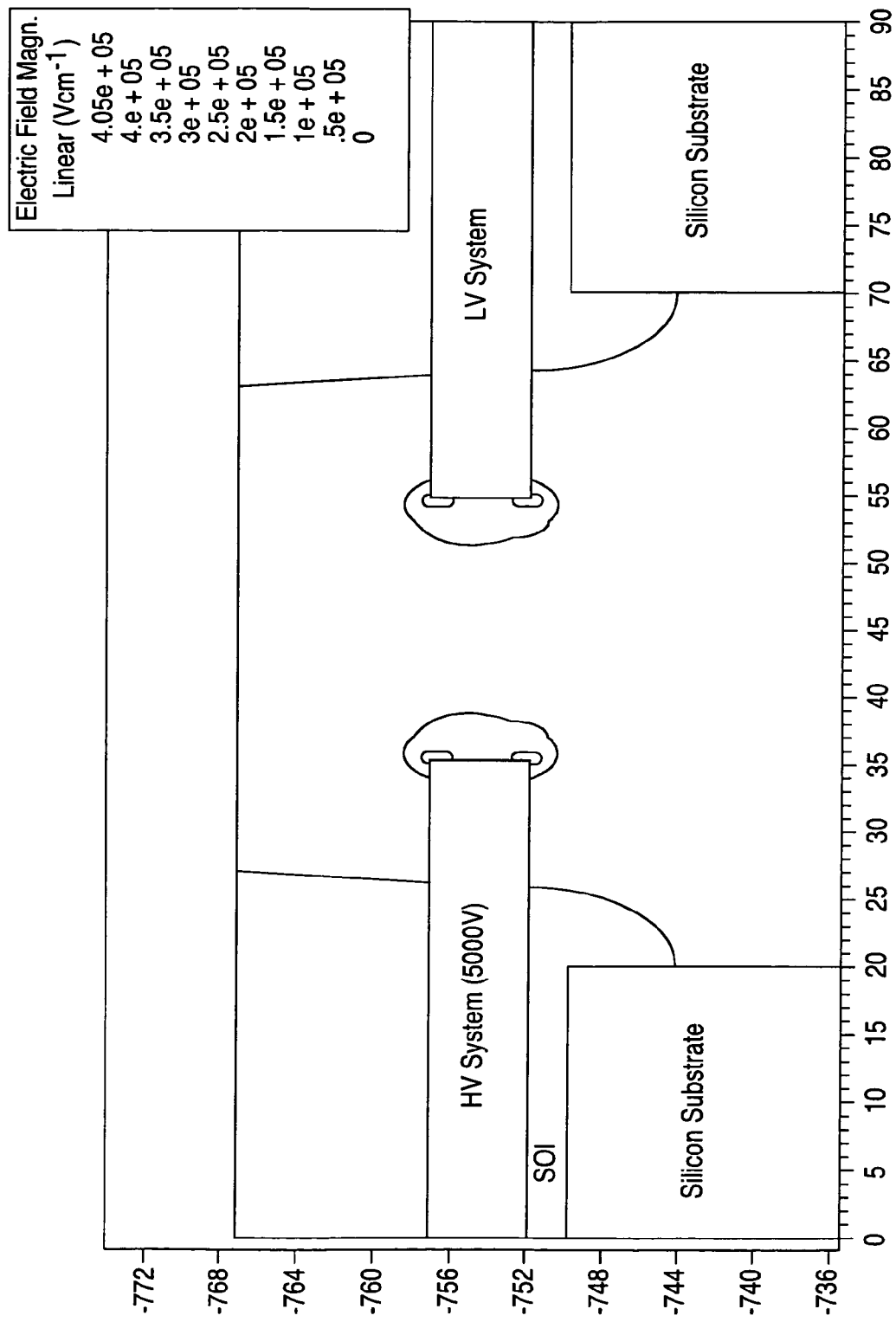
FIG. 5A is a cross section drawing illustrating doping profiles in an IC structure in accordance with the present invention.
Figure 5B:
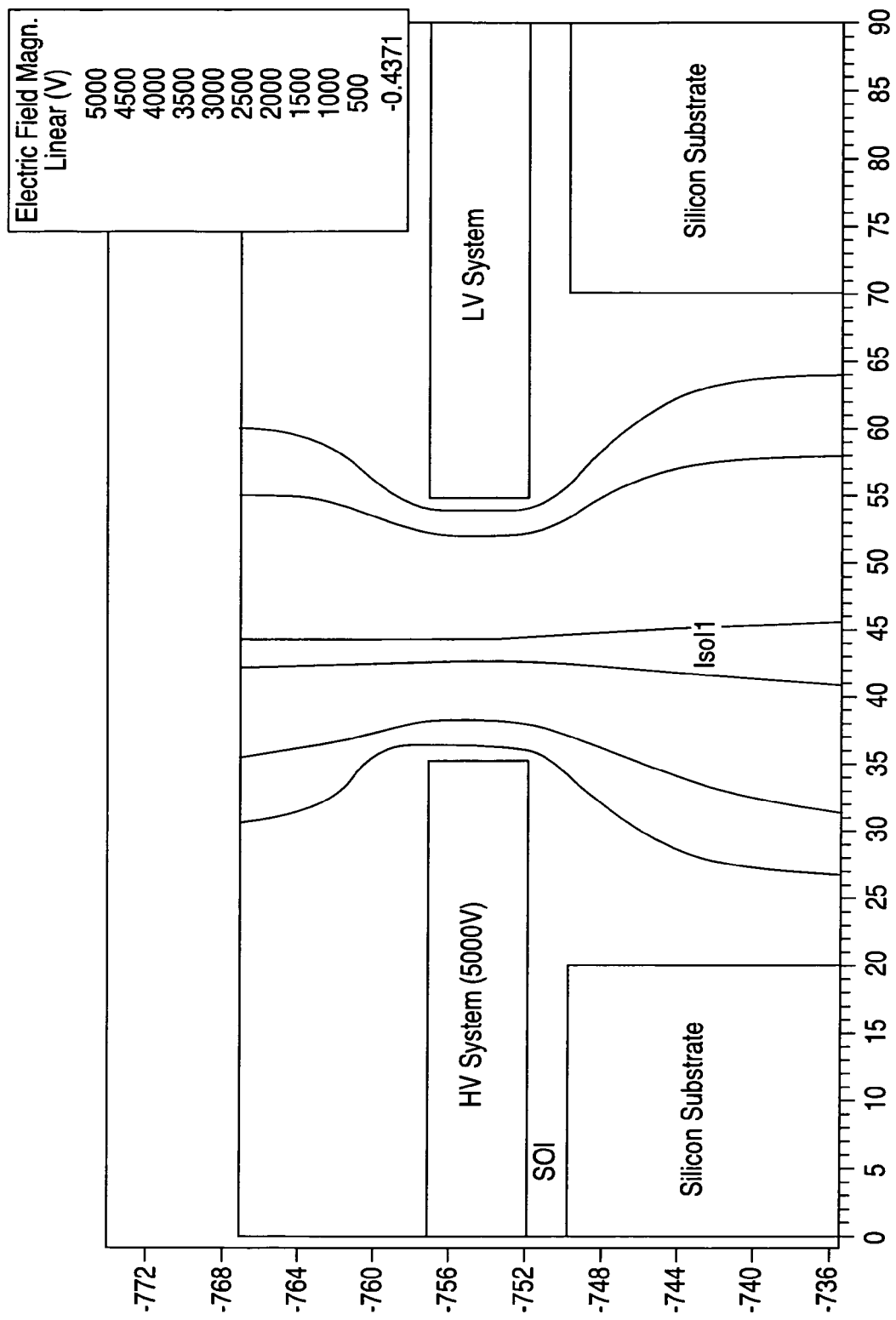
FIG. 5B is a cross section drawing illustrating doping profiles in an IC structure in accordance with the present invention

FIGS. 5A and 5B provide doping profiles of embodiments of an IC structure formed in accordance with the present invention.

It should be understood that the particular embodiments of the invention described above have been provided by way of example and that other modifications may occur to those skilled in the art without departing from the scope and spirit of the invention as express in the appended claims and their equivalents. For example, those skilled in the art will appreciate that the feature sizes and thicknesses of the SOI layer, the upper surface isolation trench and the backside isolation will depend upon a particular IC application and the characteristics of the high voltage circuitry and the low voltage circuitry.

What is claimed is:

1. A method of fabricating an integrated circuit (IC) structure on a single semiconductor substrate, the IC structure including high voltage circuitry and low voltage circuitry, the method comprising:
   forming a layer of buried dielectric material in the semiconductor substrate beneath an upper surface of the semiconductor substrate;
   forming an upper surface trench dielectric isolation region that extends from the upper surface of the semiconductor substrate to the layer of buried dielectric material to define a high voltage active substrate region and a low voltage active substrate region that are separated by the upper surface trench dielectric material;
   forming a backside trench dielectric isolation region that extends from a back side of the semiconductor substrate to the layer of buried dielectric material; and
   forming the high voltage circuitry in the high voltage active substrate region and the low voltage circuitry in the low voltage active substrate region.

2. An isolation structure for an integrated circuit (IC) structure fabricated on a single semiconductor substrate, the IC structure including high voltage circuitry and low voltage circuitry, the isolation structure comprising:
   a layer of buried dielectric material formed beneath an upper surface of the semiconductor substrate;
   an upper trench dielectric isolation region that extends from the upper surface of the semiconductor substrate to the layer of buried dielectric material to define a high voltage active substrate region having the high voltage circuitry formed therein and a low voltage active substrate region having the low voltage circuitry formed therein, the high voltage active substrate region being separated from the low voltage active substrate region by the upper surface trench dielectric material; and
   a backside trench dielectric isolation region that extends from a back side of the semiconductor substrate to the layer of buried dielectric material.

3. A method of fabricating an integrated circuit (IC) structure on a semiconductor substrate, the IC structure including high voltage circuitry and low voltage circuitry, the method comprising:
   forming a layer of dielectric material on an upper surface of the semiconductor substrate;
   forming an epitaxial silicon layer on an upper surface of the layer of dielectric material;
   forming an upper surface trench dielectric isolation region that extends from an upper surface of the epitaxial layer to the upper surface of the layer of dielectric material to define a high voltage active substrate region and a low voltage active substrate region that are separated by the upper surface trench dielectric isolation region;
   forming a first backside trench dielectric isolation region that extends from a lower surface of the semiconductor substrate to a lower surface of the layer of dielectric material;
   forming a second backside trench dielectric isolation region that extends around the perimeter of the first backside trench dielectric isolation region and from the lower surface of the semiconductor substrate to the lower surface of the layer of dielectric material;
   forming the high voltage circuitry in the high voltage active substrate region and the low voltage circuitry in the low voltage active substrate region,
   and wherein the second backside trench dielectric isolation region is formed to be self-aligned to the first backside trench dielectric isolation region.

4. A method as in claim 3, and wherein the first backside trench dielectric isolation region comprises cured photoresist.

5. A method as in claim 4, and wherein the cured photoresist comprises cured SU8.

6. A method as in claim 3, and wherein the second backside trench dielectric isolation region comprises cured photoresist.

7. A method as in claim 6, and wherein the cured photoresist comprises cured SU8.

* * * * *